(12) United States Patent
Moessner et al.

(10) Patent No.: US 6,734,476 B2
(45) Date of Patent: May 11, 2004

(54) SEMICONDUCTOR DEVICES HAVING GROUP III-V COMPOUND LAYERS

(75) Inventors: Stefan Moessner, Berlin (DE); Markus Weyers, Wildau (DE)

(73) Assignee: Ixys Corporation, Santa Clara, CA (US)

( * ) Notice: Subject to any disclaimer, the term of this patent is extended or adjusted under 35 U.S.C. 154(b) by 0 days.

(21) Appl. No.: 10/136,859

(22) Filed: Apr. 30, 2002

(65) Prior Publication Data

US 2003/0006455 A1 Jan. 9, 2003

Related U.S. Application Data

(60) Provisional application No. 60/298,433, filed on Jun. 14, 2001.

(51) Int. Cl.$^7$ .................. H01L 29/76; H01L 29/94; H01L 31/062; H01L 31/113; H01L 31/119
(52) U.S. Cl. .................. 257/289; 257/263; 257/273; 257/279; 257/472; 257/593
(58) Field of Search ................... 257/263, 266, 257/273, 279, 280, 289, 472, 565, 593

(56) References Cited

U.S. PATENT DOCUMENTS

| | | | |
|---|---|---|---|
| 4,129,879 A | 12/1978 | Tantraporn et al. | |
| 5,336,383 A | * 8/1994 | Allington | 204/458 |
| 5,578,512 A | 11/1996 | Tao | |
| 5,624,860 A | 4/1997 | Plumton et al. | |
| 5,745,857 A | 4/1998 | Maen et al. | |
| 5,837,570 A | 11/1998 | Asano | |
| 5,910,665 A | 6/1999 | Plumton et al. | |
| 6,043,125 A | 3/2000 | Williams et al. | |
| 6,156,611 A | 12/2000 | Lan et al. | |

* cited by examiner

Primary Examiner—Ngân V. Ngô
(74) Attorney, Agent, or Firm—Townsend and Townsend and Crew LLP

(57) ABSTRACT

A power semiconductor device includes a substrate of first conductivity having a dopant concentration of a first level. The substrate is a group III-V compound material. A transitional layer of first conductivity is epitaxially grown over the substrate. The transitional layer has a dopant concentration of a second level and is a group III-V compound material. An epitaxial layer of first conductivity is grown over the transitional layer and has a dopant concentration of a third level. Electrical currents flow through the transitional and epitaxial layers when the device is operating.

18 Claims, 3 Drawing Sheets

US 6,734,476 B2

SEMICONDUCTOR DEVICES HAVING GROUP III-V COMPOUND LAYERS

CROSS-REFERENCES TO RELATED APPLICATIONS

This application claims priority to U.S. Provisional Patent Application No. 60/298,433, filed on Jun. 14, 2001, which is incorporated by reference herein for all purposes.

BACKGROUND OF THE INVENTION

The present invention relates to power semiconductor devices and circuits, and more particularly, to a power semiconductor device having an epitaxial III-V layer.

Various types of semiconductor devices have been used for power handling: junction field effect transistors (JFETs), field-controlled diodes, power metal oxide-semiconductor field effect transistors (power MOSFETs), power metal semiconductor (MESFET), bipolar transistors, MOS gated thyristors, insulated gate transistors (IGTs) including insulated bipolar gate transistors (IGBTs), vertical field effect transistors (VFETs), Schottky diodes (two terminal devices), pn diodes, and the like. Power devices ideally have low forward voltage drop, high switching speed, and low control power consumption. These devices and others that are suitable for power handling, e.g., switch operations, are referred to collectively herein as "power semiconductor devices," "power devices," "power MOSFET," or "power transistors."

The VFETs are commonly used particularly for high frequency, high power application. They provide increased operation frequency and unit cell density by orienting the current flow in the vertical direction. They also minimizes parasitic capacitance and conductance from the substrate and provides higher breakdown voltage by passing the current flow in the bulk of the material instead of the device surface. Further, since the ohmic contacts and device channel are aligned vertically, the current density per unit of surface area is much higher than in a lateral FET. This means that for the same surface area VFETs will have much higher power than lateral FETs. Many recent VFETs use gallium arsenide (GaAs) or group III-V compound, which has higher electron mobility than silicon, as the semiconductor material to reduce the on-resistance.

The VFETs and other GaAs power devices like Schottky diodes, pn-diodes with breakdown voltages greater than 20 volts and current ratings of 1A and more may require usage of lightly doped N– epitaxial layers. The breakdown voltage (BV), is determined mainly by the thickness and doping concentration of the N– epitaxial layer. The BV is also affected by the geometrical factors of the p-n junctions in the devices. The composition of the passivation layers, the radius of curvature of the junction, the geometrical shape of the junction, the use of junction termination structures like guard rings, field plates, gradients of doping and combination thereof also influence the BV.

BRIEF SUMMARY OF THE INVENTION

In one embodiment, a power semiconductor device includes a substrate of first conductivity having a dopant concentration of a first level. The substrate is a group III-V compound material. A transitional layer of first conductivity is epitaxially grown over the substrate. The transitional layer has a dopant concentration of a second level and is a group III-V compound material. An epitaxial layer of first conductivity is grown over the transitional layer and has a dopant concentration of a third level. Electrical currents flow through the transitional and epitaxial layers when the device is operating.

The power device is configured to have a breakdown voltage of greater than 20 volts. The power device is configured to have a breakdown voltage of greater than 100 volts and conduct more than 1 ampere. The power device is configured to have a breakdown voltage of greater than 600 volts.

In another embodiment, a method of manufacturing a power semiconductor device includes providing a substrate of first conductivity having a dopant concentration of a first level, the substrate being a group III-V compound material. The method further includes epitaxially growing a transitional layer of first conductivity over the substrate, the transitional layer having a dopant concentration of a second level and being a group III-V compound material; and epitaxially growing an epitaxial layer of first conductivity over the transitional layer and having a dopant concentration of a third level, wherein the power device is configured to allow electrical currents to flow vertically through the transitional and epitaxial layers when the device is operating.

DETAILED DESCRIPTION OF THE INVENTION

Embodiments of the present invention relates to a power device having epitaxial III-V compound layers. The embodiments below are provided merely for illustrative purposes and should not be used to limit the scope of the present invention.

Figure 1:
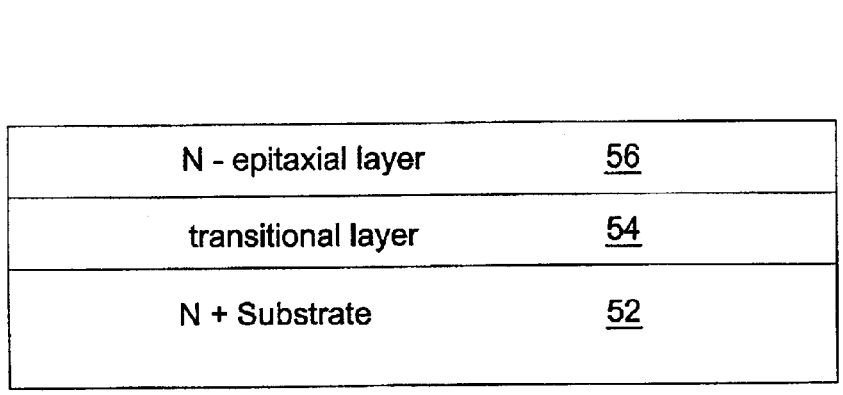
FIG. 1 illustrates a substrate assembly including a transitional layer according to one embodiment of the present invention.

FIG. 1 illustrates a schematic cross-sectional view of a substrate assembly 50 of III-V semiconductor material according to one embodiment of the present invention. The substrate assembly includes a substrate 52 of first conductivity, an interface layer 54 of first conductivity, and an epitaxial layer 56 of first conductivity. In the present embodiment, the substrate 50 is an N+ substrate, the interface layer is an N+ epitaxial layer, and the epitaxial layer 56 is an N– epitaxial layer, where all of them are GaAs materials. Alternatively, other group III-V materials, such as InP, InAs, GaAlAs, or the like may be used.

The group III-V semiconductor materials are compounds comprising two or more atoms. Accordingly, manufacturing large semiconductor chips with high homogeneity and level of defects using the III-V semiconductors materials, such as GaAs, is relatively more complex than Silicon based devices. Also, the precise doping concentration control is more difficult for GaAs substrates. The problem of doping control during the crystal growing phase increases as the diameter of the crystal increases, making it difficult to transition to larger diameter wafers which keeps the manufacturing costs high.

Referring back to FIG. 1, the N+ substrate 52 having a doping concentration of $2\times10^{18}/cm^3$ is provided. The doping concentration generally is in the range of about $10^{18}/cm^3$ to about $4\times10^{18}/cm^3$ according one embodiment of the present invention. The N+ substrate 52 is obtained by adding dopants during crystal growth, as is well known in the art.

The interface layer 54 is epitaxially grown over the substrate to serve as a transitional layer between the substrate 52 and the epitaxial layer 56. The epi layer is generally grown on a substrate under very clean environment using one of various methods: liquid phase epitaxy (LPE), molecular beam epitaxy (MBE), or a chemical vapor deposition (CVD) which includes metal organic chemical vapor deposition (MOCVD).

Epitaxial growth is a process whereby a thin crystal layer of material is grown on the surface of a crystal substrate. The epitaxial process generally takes place substantially below the melting temperature and the crystal substrate acts as the seed. The LPE process uses a compound of the semiconductor with another element which has a lower melting temperature lower than that of the semiconductor itself. The semiconductor substrate is held in the liquid compound. The substrate does not melt since the temperature of the melt is lower than the melting temperature of the substrate. As the solution is slowly cooled, a crystal semiconductor layer is grown on the seed crystal.

In the MBE process, a substrate is held in vacuum at a temperature normally in the range of 400–800° C., a relatively low temperature compared to many semiconductor processing steps. Dopant atoms are then evaporated on the surface of the substrate. The MBE process provides high dopant control and enables formation of complex doping profiles.

In the CVD process, a target substrate is placed in a process chamber. The surface of the target substrate is exposed to a chemical vapor containing the desired semiconductor material. Once a desired amount of material has been grown, the vapor is flushed out of the chamber. In the another version of CVD, the metalorganic CVD, two chemistries are used: halides and metalorganic. A group III halide is formed in the hot zone and the III-IV compound is deposited in the cold zone. Gallium arsenide and trimethylgallium is metered into the reaction chamber along with arsine to form gallium arsenide. The MOCVD process is a faster process than the MBE and can accommodate large substrates.

In present embodiment, the MOCVD is used to grow the interface layer 54 using trimethyl gallium and arsine plus disilane for doping. Alternatively, triethyl gallium, tertiary-butyl arsine, and disilane or its equivalent may be used for doping. In other embodiments, other epitaxial processes are used.

The interface or transitional layer 54 with a high level of concentration is grown, e.g., a concentration of about $10^{18}/cm^3$ or more. The doping concentration may be in the range of from $10^{18}/cm^3$ to $6\times10^{18}/cm^3$, preferably about $3\times10^{18}/cm^3$ according one embodiment of the present invention. In another embodiment, the maximum doping concentration is about $5\times10^{18}/cm^3$. In yet another embodiment, the maximum doping concentration is about $4\times10^{18}/cm^3$. If the doping concentration is too high, there is an outdiffusion from the transitional layer 54 to the N− epitaxial layer 56, which is undesirable.

Generally, the doping concentration of the transitional layer 54 is similar to that of the N+ type substrate to minimize dopant diffusion. That is, the doping concentrations of the transitional layer 54 and N+ substrate 52 is within about $5\times10^{18}/cm^3$, preferably within about $2\times10^8/cm^3$ or $3\times10^{18}/cm^3$, more preferably within about $10^{18}/cm^3$, accordingly to one embodiment of the present invention. Unlike with the outdiffusion to the N− epitaxial layer from the transitional layer 54, the outdiffusion between the transitional layer 54 and the N+ substrate 52 is not of significant concern.

The transitional layer 54 is grown to a thickness between about 0.1 micron to about 2 microns, preferably about 0.2 micron to about 1 micron, more preferably to about 0.2 to about 0.5 micron, according to one embodiment of the present invention. Alternatively, the transitional layer 54 may be thicker than about 2 micron; however, this would increase the manufacturing costs significantly since it is expensive to grow the epitaxial layer.

After the transitional layer 54 has been grown, the epitaxial layer 56 is grown over the transitional layer 54. The epitaxial layer 56 is provided with a dopant concentration level of less than about $10^{18}/cm^3$, or less than about $10^{17}/cm^3$, or preferably less than about $10^{16}/cm^3$. In one embodiment, the dopant concentration of the N− epitaxial layer 56 is between about $10^{14}/cm^3$ to $10^{16}/cm^3$.

In one embodiment, the epitaxial layer is grown in situ in the same chamber without removing the substrate from the process chamber wherein the transitional layer 54 has been grown. This in situ process minimizes the chances of the substrate assembly 50 being contaminated which may cause crystal defects. As a result, the present in-situ method facilitates repeatability from run-to-run or wafer-to-wafer, and also uniformity within a single wafer, which in turn contributes to more uniform breakdown voltage, switching time and forward voltage drop of the power devices that are formed using the substrate assembly 50.

Figure 2:
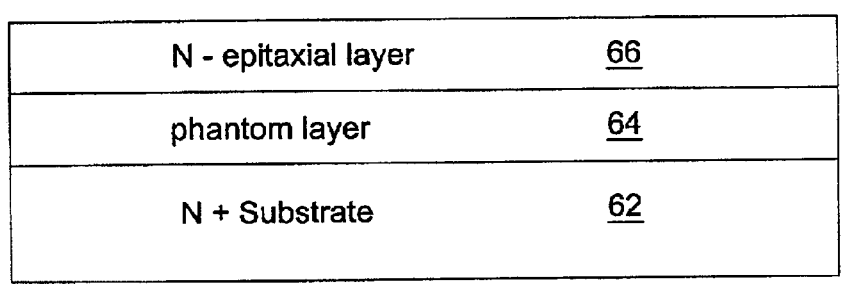
FIG. 2 illustrates a substrate assembly including a phantom layer.

Referring back to the transitional layer 54, it removes or inverts a "phantom" layer that may form on top of the substrate 52. A thin insulating layer or phantom layer 64 is generally formed on a substrate 62 during an epitaxial process to grow an epitaxial layer 64 over the substrate 62, as shown in FIG. 2. Accordingly, a resulting substrate assembly 60 is provided with the phantom layer that is undesirable for vertical power device operations. For example, in some instances, a p type phantom layer may be formed on the n type substrate. The p type phantom layer acts as a barrier or a blocking junction to a vertical current flowing through the devices. The phantom layer may, therefore, increases the forward voltage drop of the device in its conducting mode and slows the switching operations. It has been discovered that the phantom layer is formed generally on relatively lightly doped substrates, i.e., a substrate having a concentration of about $10^{18}$ atoms/$cm^3$ or less.

In one embodiment, the transitional layer 54 neutralizes or removes the phantom layer because the dopants of the transitional layer would diffuse into the phantom layer (p type) and invert it into an n type layer of sufficient concentration to prevent it from impeding the vertical current flow, thereby lowering the on-resistance of the power device. Furthermore, the existence of the highly doped transitional layer 54, upon onset of current conduction in the device, acts as "fludding" the vertical structure with carriers that fills the traps in the phantom layer or dynamically acts as a conductivity modulation layer to reduce the resistivity of the phantom layer. This results in reduced on-state voltage drop for the power device.

According to one embodiment, the substrate assembly 50 described above is particularly suited for vertical GaAs power devices like Schottky diodes, pn diodes, or other two terminal devices with breakdown voltages between about 20 volts to about 600 volts or more and current ratings of 1 ampere or more. In another embodiment, the vertical device has a breakdown voltage of 100 volts or more, or 300 volts or more.

Alternatively, the substrate assembly 50 may be used in connection with vertical power transistors (three terminal devices) although GaAs and other group III-V compound materials have generally not be used in connection with the vertical transistors for various reasons, one such a problem being the phantom layer phenomenon. However, the transitional layer 54 disclosed herein solves one or more of the problems associated with using the group III-V compound materials in vertical power transistors.

Figure 4:
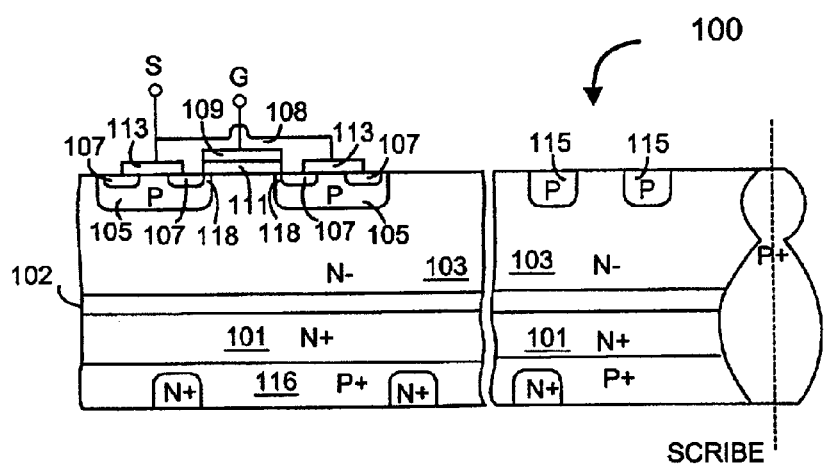
FIG. 4 illustrates a cross-sectional view of a planar, vertical double diffused field effect transistor including a substrate assembly with a transitional layer according to one embodiment of the present invention.
Figure 3:
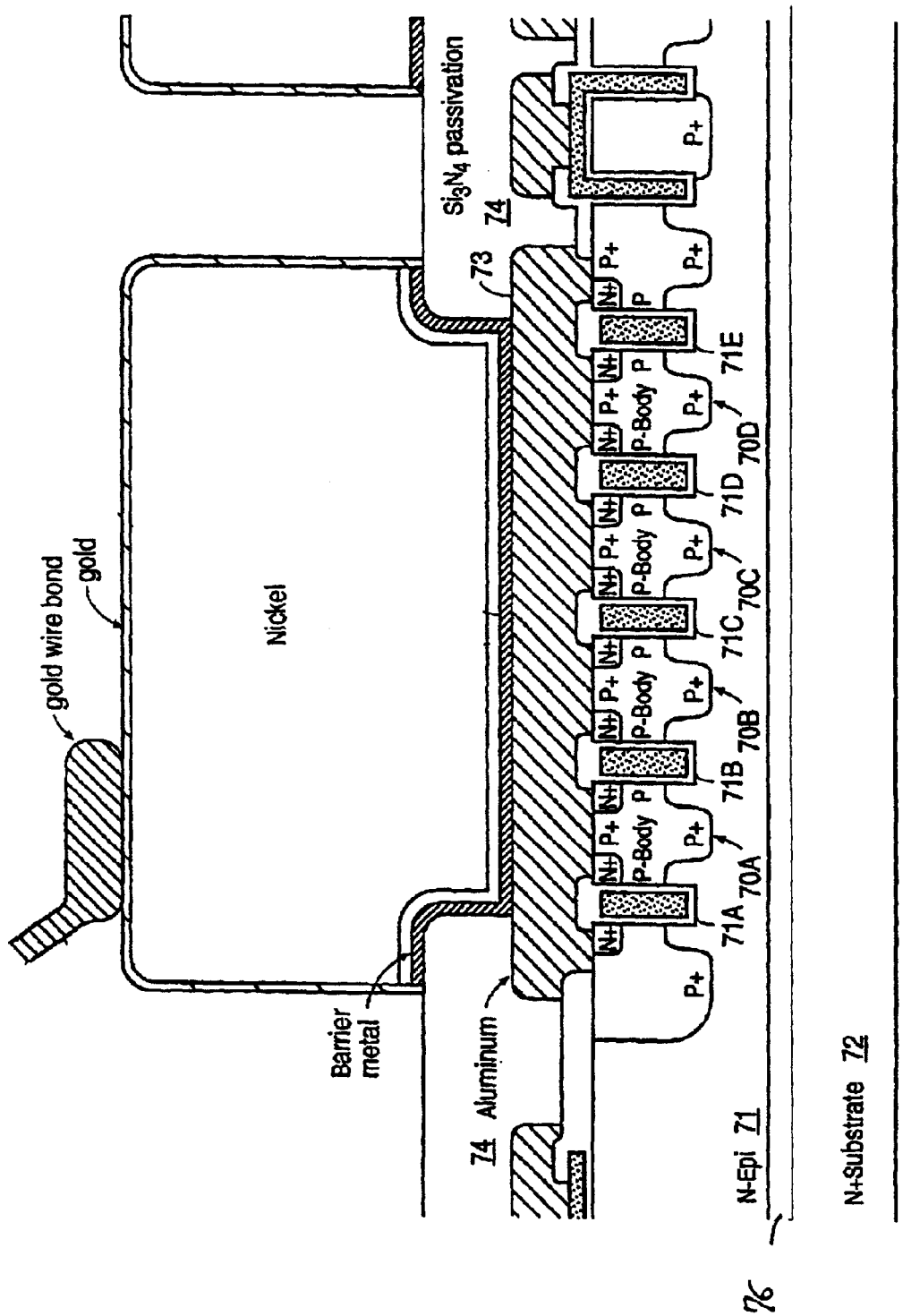
FIG. 3 illustrates a cross-sectional view of a vertical power MESFET including a substrate assembly with a transitional layer according to one embodiment of the present invention.
Figure 5:
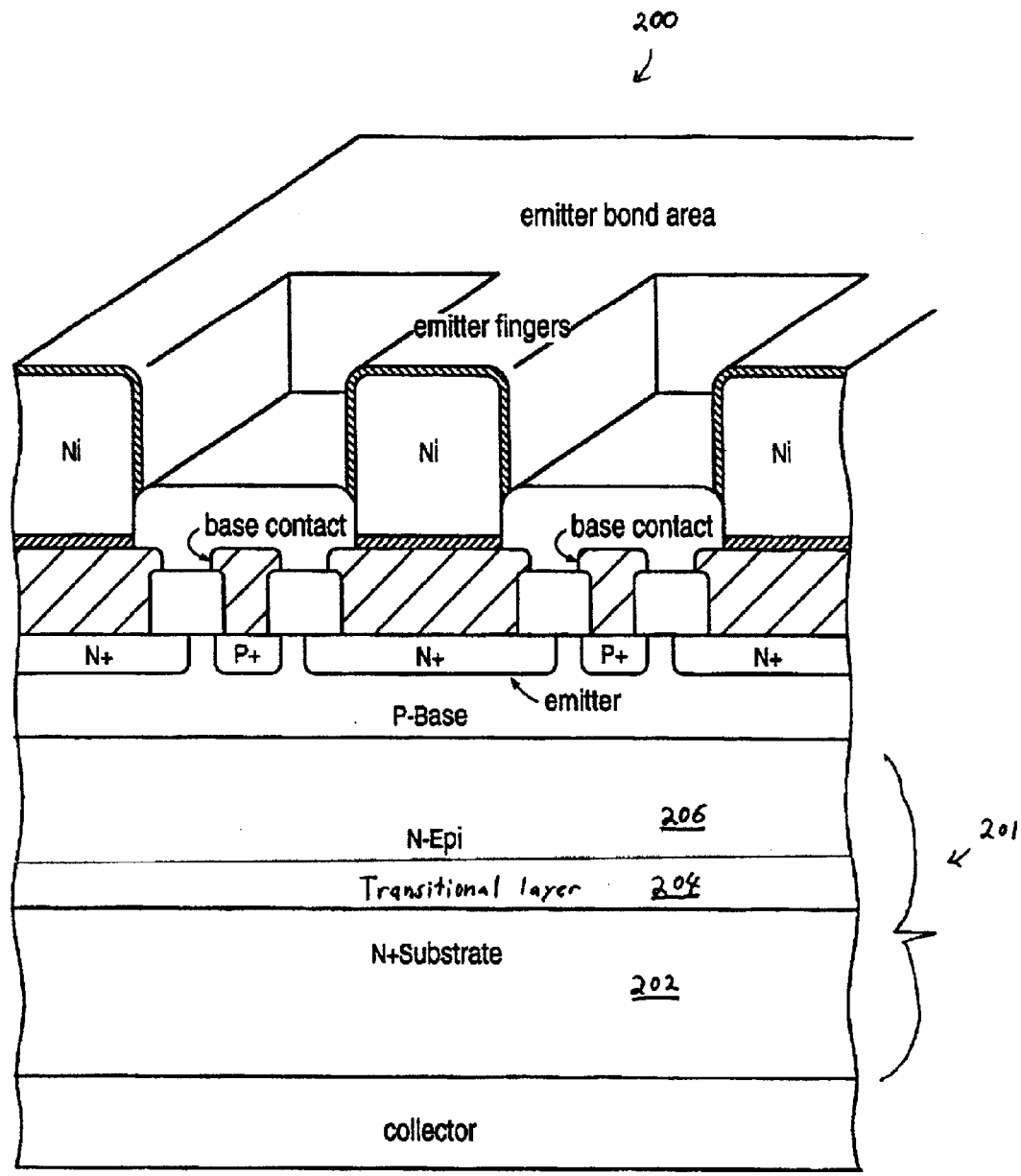
FIG. 5 illustrates a cross-sectional view of a vertical power bipolar transistor including a substrate assembly with a transitional layer according to one embodiment of the present invention.

Accordingly, FIGS. 3–5 illustrate schematic cross-sectional views of various vertical power transistors that incorporates the substrate assembly 50 according to embodiments of the present invention. A vertical power MESFET 70 is formed in an N-type epitaxial layer 71, which is grown over an N+ substrate 72 (FIG. 3). An epitaxial interface layer 76, corresponding to the transitional layer 54 above, is provided between the N– type epitaxial layer 71 and the substrate 72. The layers 71 and 76 are formed within a single process chamber sequentially. The substrate 72, interface layer 76, and epitaxial layer 71 together comprise a GaAs substrate assembly corresponding to the substrate assembly 50 of FIG. 1.

Power MESFET 70 includes individual transistor cells 70A–70D, which are formed between trenches 71A–71E, respectively. In this embodiment trenches 71A–71E are formed in a rectilinear pattern. Alternatively, they may be formed in some other polygonal pattern or as a series of parallel trenches.

A thin metal layer 73, typically aluminum, formed at the top surface of epitaxial layer 71, contacts with the N+ source regions to form a source metal contact. The thin metal layer 73 is typically in the range of 0.8 to 2.8 μm thick. The P-body region within each cell is shorted to the N+ source region by means of thin metal layer 73. A passivation layer 74, which in this embodiment consists of $Si_3N_4$ is formed over the top surface of the MESFET 70.

The MESFET 70 is an N-channel device. Thus, when the voltage at the gate is increased, an electron current flows downward from N+ source regions through a channel adjacent the trench and into the drain, which is represented by the epitaxial layer 71, interface layer and substrate 72. In one embodiment, the power MESFET 70 is configured to have a breakdown voltage of greater than 20 volts. In another embodiment, the power MESFET is configured to have a breakdown voltage of greater than 100 volts and conduct more than 1 ampere. Yet in another embodiment, the power MESFET is configured to have a breakdown voltage of greater than 600 volts.

FIG. 4 is a simplified cross-sectional view of a planar, vertical field effect transistor 100 according one embodiment of the present invention. The device 100 includes an N+ type semiconductor substrate 101. An epitaxial interface layer 102, corresponding to the transitional layer 54, is formed overlying the substrate 101 using any one of the epitaxial processes described above. An N– type layer 103 is formed overlying the epitaxial interface layer 102. The layers 102 and 103 are formed in-situ in a single process chamber. The substrate 101, interface layer 102, and epitaxial layer 103 together comprise a GaAs substrate assembly corresponding to the substrate assembly 50 of FIG. 1.

P/P+ type well regions 105 define onto the N– type layer 103. The present device also includes a plurality of N type source regions 107 defined into a perimeter of each P/P+ type well region 105. The device includes a gate electrode (G) 109 defined overlying a thin layer of gate oxide 111 and the like. Source metallization 113 is defined overlying the N type source regions 107 and connects 108 each source region together. A P type diffusion region 116 is defined overlying the backside of the N+ type substrate. The P type diffusion region is a P+ type drain region. A channel region 118 is defined in a portion of the P/P+ type well region between the source region 107 and a portion of the N– type layer 103.

The present device also includes a plurality of guard ring structures 115. The guard ring structures are each P type diffusions, typically surrounding the periphery of the integrated circuit chip active cell region. The guard ring structure tends to keep the main conduction region toward the active cell region of the integrated circuit chip, thereby preserving the voltage rating of the device.

FIG. 5 illustrates a cross-sectional view of a vertical power bipolar transistor 200 including a GaAs substrate assembly 201 corresponding to the substrate assembly 50 of FIG. 1. For example, the substrate assembly 201 includes an N+ substrate 202, a transitional layer 204 grown over the substrate 202, and an N– epitaxial layer 204 grown over the transitional layer 204.

While the invention has been particularly illustrated and described with reference to specific embodiments thereof, it will be understood by those skilled in the art that the foregoing and other changes in the form and details may be made therein without departing from the spirit or scope of the invention. Therefore, the scope of this invention should not be limited to the embodiments described above, and should instead be defined by the following claims.

What is claimed is:

1. A power semiconductor device, comprising:
   a substrate of first conductivity having a dopant concentration of a first level, the substrate being a group III-V compound material;
   a transitional layer of first conductivity epitaxially grown over the substrate, the transitional layer having a dopant concentration of a second level and being a group III-V compound material; and
   an epitaxial layer of first conductivity grown over the transitional layer and having a dopant concentration of a third level,
   wherein electrical currents flow through the transitional and epitaxial layers when the device is operating,
   wherein the second concentration level is greater than both the first concentration level and third concentration level,
   wherein the device is configured to have a breakdown voltage of greater than 20 volts.

2. The power device of claim 1, wherein the first conductivity is N type conductivity, the device further comprising:
   a dielectric phantom layer formed on the substrate, the transitional layer being configured to diffuse dopants into the phantom layer to reduce an on-resistance of the device.

3. The power device of claim 1, wherein the group III-V compound material is GaAs.

4. The power device of claim 3, wherein the transitional and epitaxial layers are formed within a single chamber in sequential steps.

5. The power device of claim 1, wherein the second dopant concentration level is substantially the same as the first dopant concentration level.

6. The power device of claim 5, wherein either the second dopant concentration level or the first dopant concentration level is no more than about 2 times greater than the other concentration level.

7. The power device of claim 1, wherein the power device is a two-terminal device.

8. The power device of claim 7, wherein the device is configured to have a breakdown voltage of greater than 100 volts and configured to conduct more than 1 ampere.

9. The power device of claim 7, wherein the device has a breakdown voltage of greater than 600 volts.

10. The power device of claim 1, wherein the device is a Schottky diode having a breakdown voltage of greater than 20 volts and a current rating of 1 ampere or more.

11. A vertical power semiconductor device, comprising:

a substrate of first conductivity having a dopant concentration of a first level, the substrate being GaAs;

a transitional layer of first conductivity epitaxially grown over the substrate, the transitional layer having a dopant concentration of a second level and being GaAs; and an epitaxial layer of first conductivity grown over the transitional layer and having a dopant concentration of a third level and being GaAs, wherein electrical currents flow vertically through the transitional and epitaxial layers when the device is operating, wherein the device is configured to handle voltages greater than 100 volts and conduct more than 1 amperes, wherein the second dopant concentration level is greater than the third dopant concentration level.

12. A two-terminal power device, comprising:

a substrate of first conductivity having a dopant concentration of a first level, the substrate being a group III-V compound material;

a transitional layer of first conductivity epitaxially grown over the substrate, the transitional layer having a dopant concentration of a second level and being a group III-V compound material; and an epitaxial layer of first conductivity grown over the transitional layer and having a dopant concentration of a third level, wherein electrical currents flow through the transitional and epitaxial layers when the device is operating, wherein the second concentration level is greater than the third concentration level.

13. The two-terminal device of claim 12, wherein the device is a diode having a breakdown voltage of at least about 20 volts.

14. The two-terminal device of claim 12, wherein the transitional layer is configured to neutralize a phantom layer formed on the substrate by having dopants in the transitional layer to diffuse into the phantom layer, the phantom layer being a dielectric layer.

15. The two-terminal device of claim 12, wherein the second dopant concentration is higher than the first dopant concentration.

16. The two-terminal device of claim 12, wherein the transitional and epitaxial layers are sequentially formed in the same chamber.

17. The power device of claim 12, wherein the second dopant concentration level is substantially the same as the first dopant concentration level.

18. The power device of claim 12, wherein either the second dopant concentration level or the first dopant concentration level is no more than about 2 times greater than the other concentration level.

* * * * *